(12) United States Patent
Daigo et al.

(10) Patent No.: US 12,185,507 B2
(45) Date of Patent: Dec. 31, 2024

(54) POWER CONVERSION DEVICE

(71) Applicant: Mitsubishi Electric Corporation, Tokyo (JP)

(72) Inventors: Toru Daigo, Tokyo (JP); Taisuke Iwakiri, Tokyo (JP); Katsuyuki Ochiai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 220 days.

(21) Appl. No.: 17/877,200

(22) Filed: Jul. 29, 2022

(65) Prior Publication Data
US 2023/0309275 A1    Sep. 28, 2023

(30) Foreign Application Priority Data

Mar. 24, 2022   (JP) ................ 2022-047775

(51) Int. Cl.
*H05K 7/20*   (2006.01)
*H05K 5/04*   (2006.01)

(52) U.S. Cl.
CPC ............ *H05K 7/209* (2013.01); *H05K 5/04* (2013.01); *H05K 7/20909* (2013.01)

(58) Field of Classification Search
CPC ....... H05K 7/209; H05K 7/20909; H05K 5/04
See application file for complete search history.

(56) References Cited

U.S. PATENT DOCUMENTS

| | | | |
|---|---|---|---|
| 2014/0160823 A1 | 6/2014 | Uetake et al. | |
| 2018/0286781 A1* | 10/2018 | Yoshihara | ............ H01L 23/473 |
| 2020/0286812 A1* | 9/2020 | Tochiyama | ............ H05K 7/209 |
| 2020/0359533 A1* | 11/2020 | Iwakiri | ................. H05K 7/209 |
| 2022/0295672 A1* | 9/2022 | Yamabe | ................. H02M 7/003 |

FOREIGN PATENT DOCUMENTS

| | | |
|---|---|---|
| JP | 2013-31330 A | 2/2013 |
| JP | 2015-84609 A | 4/2015 |
| JP | 2017-108524 A | 6/2017 |
| JP | 2017-139886 A | 8/2017 |

(Continued)

OTHER PUBLICATIONS

JP-2021197838-A english translation (Year: 2021).*
Office Action issued May 30, 2023 in Japanese Application No. 2022-047775.

*Primary Examiner* — Mukundbhai G Patel
(74) *Attorney, Agent, or Firm* — Sughrue Mion, PLLC; Richard C. Turner

(57) ABSTRACT

To obtain a power conversion device reduced in size and weight wherein heat generated from a capacity module is sufficiently dissipated, thus enabling prevention of a rise in the temperature of the capacity module. The power conversion device includes a first cooler which, having mounted thereon the capacity module, cools heat generated from the capacity module; a second cooler which, having mounted thereon a semiconductor module, cools heat generated from the semiconductor module; and a heat dissipation plate which, being thermally connected to the capacity module and to the second cooler, dissipates via the second cooler one portion of the heat generated from the capacity module, wherein the first and second coolers, being disposed so as to form a refrigerant flow path, both share a refrigerant.

19 Claims, 6 Drawing Sheets

(56) References Cited

FOREIGN PATENT DOCUMENTS

| | | | | |
|---|---|---|---|---|
| JP | 2021-52443 | A | 4/2021 | |
| JP | 6961047 | B1 | 11/2021 | |
| JP | 2021197838 | A * | 12/2021 | ............ H05K 7/209 |
| WO | 2017/170184 | A1 | 10/2017 | |
| WO | 2020/040278 | A1 | 2/2020 | |

* cited by examiner

POWER CONVERSION DEVICE

BACKGROUND OF THE INVENTION

Field of the Invention

The present disclosure relates to the field of a power conversion device.

Description of the Related Art

A power conversion device, such as an inverter, a DC/DC converter, or an in-vehicle charger, has heretofore been mounted on, for example, an electric automobile or a hybrid vehicle. A power conversion device which is a switching device, such as an inverter, has mounted thereon a capacity module to smooth a current supplied from a power source, and generally includes a conductive material which electrically connects the capacity module and a semiconductor module and a control device which switchingly controls the semiconductor module. For example, the capacity module, having the function of storing and discharging electricity, is generally configured of a capacitive element, such as a capacitor.

Also, the capacity module, other than being mounted on an inverter which converts the power between a power source and a rotating electrical machine, is also mounted on a power conversion device, such as a converter which converts the voltage of the power source to another voltage. The power conversion device is configured so as to control a switching element of the mounted semiconductor module, thereby to switch the supply pathway of the current supplied from the power source, and thus to control the current which drives the rotating electrical machine.

In a high-power power conversion device, a high current flows through the semiconductor and capacity modules, and so the semiconductor and capacity modules generate heat. In particular, when the capacity module generates heat, there is a case in which the capacitive element in the capacity module melts and short-circuits, leading to a failure, and at worst, there is a problem in that the power conversion device is destroyed.

For this reason, a power conversion device is proposed wherein the surface of the casing of a capacitor module (the capacity module) is joined with a heat exchanger plate to a semiconductor cooler which cools a power semiconductor module (the semiconductor module), and heat generated from the capacitor module is dissipated from the semiconductor cooler via the heat exchanger plate (for example, refer to PTL 1).

[PTL 1] JP-A-2017-108524

In the heretofore known power conversion device disclosed in PTL 1, however, the heat generated from the capacity module is only dissipated from the semiconductor cooler via the heat exchanger plate. When supplying a high current to the capacity module, the capacity module generates high temperature heat, and the heretofore known cooling using the heat exchanger plate alone is not enough, so that there is a need to enhance cooling effect by, for example, cooling the capacity module by installing a cooler on the capacity module as well and thus increasing the number of pathways through which to dissipate the heat generated from the capacity module.

When the heretofore known power conversion device disclosed in PTL 1 is used, some cooling methods can be considered. For example, as one of the measures, a configuration is adopted such that the semiconductor cooler is extended and the capacity module is also mounted on the semiconductor cooler. When the connecting position of the heat exchanger plate connected to the semiconductor cooler is close to the capacity module, however, the heat of the capacity module dissipated from the heat exchanger plate thermally interferes with the capacity module via the semiconductor cooler, so that the capacity module is not sufficiently cooled. Thus, the connecting position of the heat exchanger plate connected to the semiconductor cooler only has to be connected to the position in which the capacity module can be sufficiently cooled without being affected by the thermal interference with the capacity module. In this case, however, there is a problem in that the semiconductor cooler is increased in size.

Also, as another one of the measures to prevent the thermal interference, it only necessary to adopt a configuration such that two cooling systems are installed, that is, a capacity module cooler which cools the capacity module is installed separately from a semiconductor module cooler, and that the two coolers are disposed separated from each other so that the heat generated from the capacity module may not thermally interfere with the capacity module cooler via the heat exchanger plate and the semiconductor cooler. In this case, however, there is a problem in that the configuration is of two cooling systems, which results in a complication in cooling structure and also in an increase in weight. In particular, an inverter acting as a power conversion device to be mounted on a hybrid vehicle is required to be small in size and light in weight for the purpose of efficiency improvement in terms of fuel consumption, but in the case of the heretofore known power conversion device disclosed in PTL 1, there is a problem in that it is difficult, due to the previously described problem, to realize a reduction in size and weight after an enhancement in cooling effect and also, as a result, fuel economy is lowered.

SUMMARY OF THE INVENTION

The present disclosure has been made to solve the above problem and an object of the present disclosure is to provide a power conversion device reduced in size and weight wherein heat generated from a capacity module is sufficiently dissipated, thus enabling prevention of a rise in the temperature of the capacity module.

The power conversion device according to one aspect of the present disclosure includes a first cooler which, having mounted thereon a capacity module, cools heat generated from the capacity module; a second cooler which, having mounted thereon a semiconductor module, cools heat generated from the semiconductor module; and a heat dissipation plate which, being thermally connected to the capacity module and to the second cooler, dissipates via the second cooler one portion of the heat generated from the capacity module, wherein the first and second coolers, being disposed so as to form a refrigerant flow path, both share a refrigerant.

The power conversion device of one aspect of the present disclosure provides is reduced in size and weight and sufficiently dissipates the heat generated from the capacity module, thus enabling prevention of a rise in the temperature of the capacity module.

DETAILED DESCRIPTION OF THE PREFERRED EMBODIMENTS

First Embodiment

Hereinafter, a description will be given, based on the drawings, of the first embodiment of the present disclosure. In the individual drawings, identical signs show identical or equivalent portions.

Figure 1:
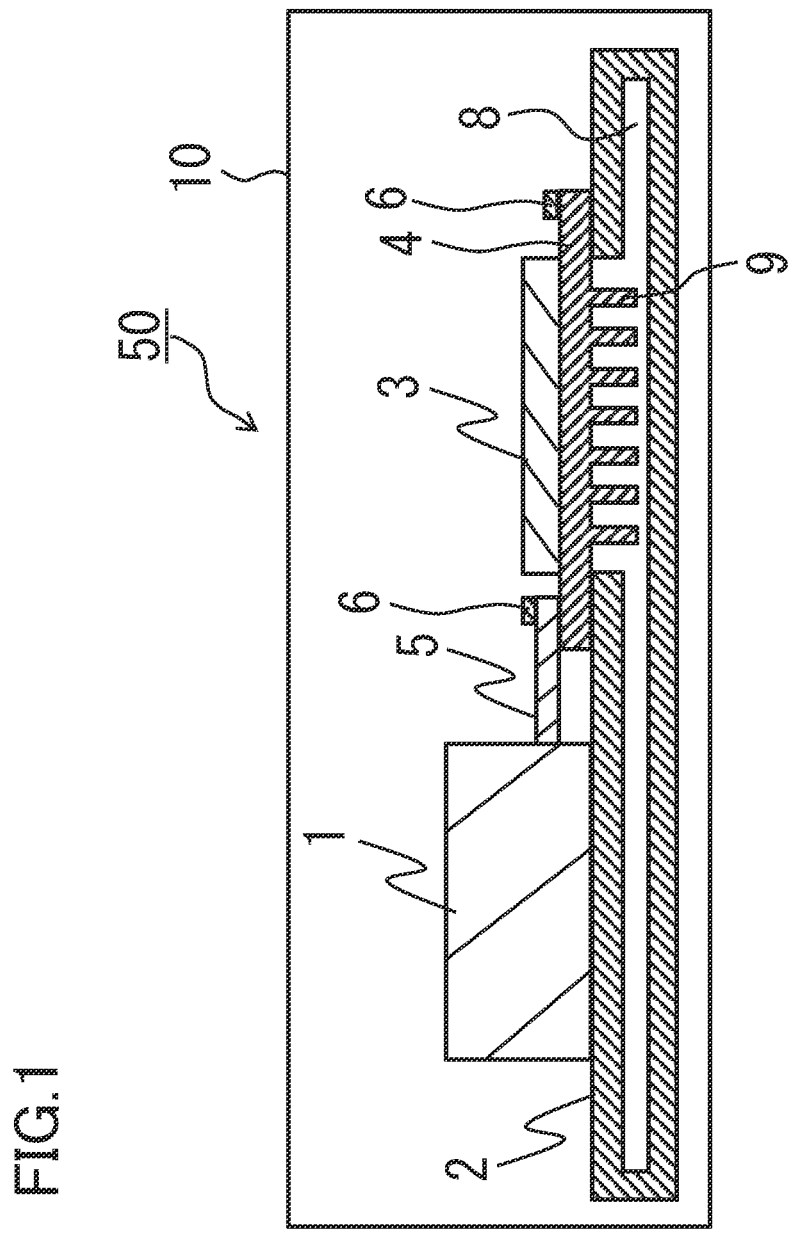
FIG. 1 is side view showing a power conversion device according to the first embodiment of the present disclosure.

FIG. 1 is a side view showing a power conversion device according to the first embodiment of the present disclosure. As shown in FIG. 1, a power conversion device 50 according to the first embodiment of the present disclosure includes a first cooler 2 which, having mounted thereon a capacity module 1, cools heat generated from the capacity module 1, a second cooler 4 which, having mounted thereon a semiconductor module 3, cools heat generated from the semiconductor module 3, and a heat dissipation plate 5 which, being thermally connected to the capacity module 1 and to the second cooler 4, dissipates via the second cooler 4 one portion of the heat generated from the capacity module 1, wherein the first and second coolers 2 and 4 and the heat dissipation plate 5 are housed in a housing 10. Also, in the power conversion device 50 according to the first embodiment of the present disclosure, the first and second coolers 2 and 4, being disposed so as to form a refrigerant flow path 8 (a cooling path), both share a refrigerant.

The power conversion device 50 according to the first embodiment of the present disclosure, having mounted thereon the capacity module 1 to smooth a current supplied from a power source, includes a conductive material, such as a busbar, which electrically connects the capacity module 1 and the semiconductor module 3, and a control device which switchingly controls the semiconductor module 3, but FIG. 1 omits the illustration of the conductive material, such as a busbar, which connects the semiconductor module 3 and the capacity module 1 and of the control device (control board) which controls on or off of the semiconductor module 3.

The semiconductor module 3 is disposed on and in contact with the surface of the second cooler 4 so as to cool the heat generated from the semiconductor module 3. Also, the projection area of the second cooler 4 is formed to be larger than that of the semiconductor module 3. This enables a reduction in the impact of the thermal interference with the heat dissipation plate 5 caused by the heat generated from the semiconductor module 3, making it easier to connect the heat dissipation plate 5 to the second cooler 4.

The capacity module 1 is disposed on and in contact with the surface of the first cooler 2 so as to cool the heat generated from the capacity module 1. The capacity module 1 is cooled by the first cooler 2. On the other hand, one portion of the heat generated from the capacity module 1 is also cooled by the second cooler 4 via the heat dissipation plate 5. That is, the heat generated from the capacity module 1 is cooled through two pathways, when roughly divided, the pathway of heat dissipation from the first cooler 2 to the refrigerant and the pathway of heat dissipation from the second cooler 4 to the refrigerant via the heat dissipation plate 5.

Also, in the power conversion device 50 according to the first embodiment of the present disclosure, the heat dissipation plate 5, being a copper plate, is connected to the second cooler 4 without via the first cooler 2. Also, the heat dissipation plate 5 is connected to the connecting portion of the second cooler 4 connected to the first cooler 2. The second cooler 4 is fixed to the first cooler 2 together with the heat dissipation plate 5 by a fixing member 6.

Also, in the power conversion device 50 according to the first embodiment of the present disclosure, the first cooler 2 is a casing having inside thereof the refrigerant, and the second cooler 4 is, for example, a heatsink which has fins 9 and is a metal plate. Also, the first cooler 2 of the power conversion device 50 according to the first embodiment of the present disclosure is formed of a metal alloy containing aluminum and specifically is an aluminum die-casting. Also, the heatsink which is the second cooler 4 is formed of aluminum.

Also, in the power conversion device 50, as described above, the first and second coolers 2 and 4, being disposed so as to form the refrigerant flow path 8, both share the refrigerant. In the power conversion device 50 according to the first embodiment of the present disclosure, the first and second coolers 2 and 4 are disposed so aa to configure all the refrigerant flow path 8 (cooling path). In the power conversion device 50 according to the first embodiment of the present disclosure, the refrigerant flow path 8 (cooling path) is made singular and thereby is configured so that the same refrigerant flows through the first and second coolers 2 and 4. According to the power conversion device 50 of the first embodiment of the present disclosure, it is possible to adopt the structure of cooling the first and second coolers 2 and 4 with the identical refrigerant, enabling a reduction in size and weight. Also, at this time, the projection area of the second cooler 4 is made smaller than that of the refrigerant flow path 8 (cooling path) configured of the first and second coolers 2 and 4, thereby enabling a reduction in the projection area in which to seal the first and second coolers 2 and 4.

Figure 2:
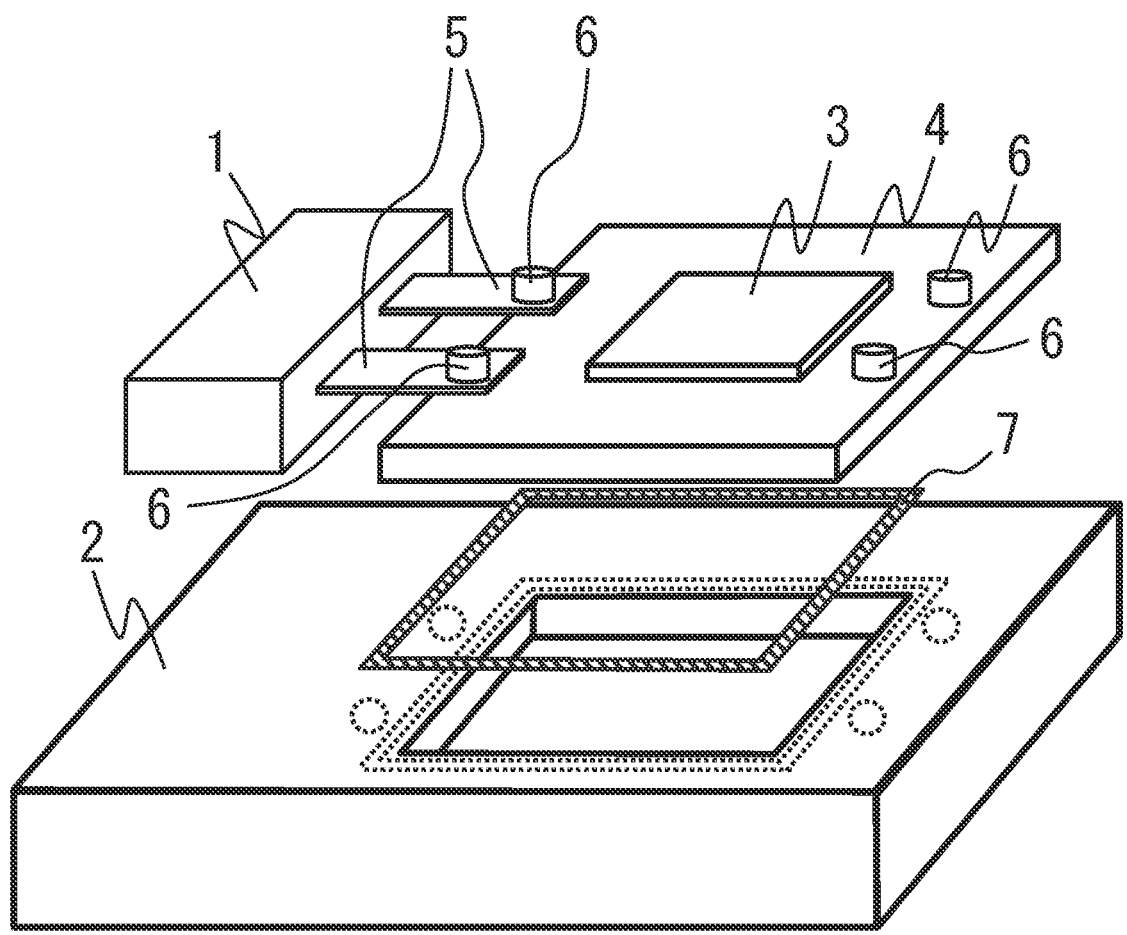
FIG. 2 is an exploded perspective view showing the power conversion device according to the first embodiment of the present disclosure.

FIG. 2 is an exploded perspective view showing the power conversion device according to the first embodiment of the present disclosure. FIG. 2 specifically shows an exploded perspective view of the structure in which the housing 10 is excluded from the power conversion device 50 shown in FIG. 1.

As shown in FIG. 2, in the power conversion device 50 according to the first embodiment of the present disclosure, a seal member 7 is disposed between the first and second coolers 2 and 4. The second cooler 4 is provided on the first cooler 2 via the seal member 7. The seal member 7 is disposed to improve sealing properties so as to prevent a leakage of the refrigerant flowing through the refrigerant flow path 8 (cooling path) configured of the first and second coolers 2 and 4. The heat dissipation plates 5 are tightened together with bolts which are the fixing members 6 used to seal the first cooler 2 and the second cooler 4. It is thereby possible to omit screws, or the like, with which to attach the heat dissipation plates 5 to the second cooler 4.

A description will now be given of the sealing properties of the first and second coolers 2 and 4 of the power conversion device 50 according to the first embodiment of the present disclosure. In some cases, the sealing properties are not enough when the first and second coolers 2 and 4 are fixed only by the fixing members 6. When the refrigerant is a gas, such as air, there is also a case in which no particular problem occurs even when the gas leaks from the refrigerant flow path 8. In this case, the first and second coolers 2 and 4 may be fixed only by the fixing members 6. When the refrigerant is a liquid, such as water, however, a short circuit, or the like, occurs when the liquid leaks from the interspace between the first and second coolers 2 and 4 which configure the refrigerant flow path 8, causing a failure, so that it is necessary to prevent the leakage of the refrigerant.

In this case, for example, an O-ring or a liquid gasket is inserted, as the seal member 7, between the first and second coolers 2 and 4 so as to prevent the refrigerant which is the liquid from leaking from the interspace between the portions of the first and second coolers 2 and 4 which are connected together. For example, when using the O-ring, the bolts are used as the fixing members 6 and fastened, thereby fixing the second cooler 4 so as to crush the O-ring in the direction of the first cooler 2. By so doing, the interspace through which the liquid may leak is filled, thus improving the sealing properties. At this time, when a foreign substance sticks between the seal member 7 and the second or first cooler 4 or 2, a clearance is formed, leading to a decrease in the sealing properties, so that there is the possibility of causing a processing defect. An increase in the sealing area of the seal member 7 increases the risk of a leakage of the liquid resulting from the foreign substance sticking or the processing defect. For this reason, it is desirable that the sealing area of the seal member 7 is small.

In the power conversion device 50 according to the first embodiment of the present disclosure, the heat dissipation plates 5 are fixed together with the first and second coolers 2 and 4 at the fixing points at which to fix the respective fixing members 6, and thereby the positions in which the heat dissipation plates 5 are connected to the second cooler 4 and the fixing points at which the second cooler 4 is fixed to the first cooler 2 can be used in common and not separately. This removes the necessity of providing other members, such as screws, in the positions in which to connect the heat dissipation plates 5 to the second cooler 4, enabling a reduction in the number of members, so that it is possible to obtain the advantageous effect of a reduction in weight.

In this way, according to the power conversion device 50 of the first embodiment of the present disclosure, the heat generated from the capacity module 1 is dissipated from the second cooler 4 connected to the heat dissipation plates 5, so that it is more possible to prevent thermal interference than when the heat dissipation plates 5 are directly connected only to the first cooler 2.

As previously described, the heat generated from the capacity module 1 is cooled through two pathways, when roughly divided, the pathway of heat dissipation from the first cooler 2 to the refrigerant and the pathway of heat dissipation from the second cooler 4 to the refrigerant via the heat dissipation plate 5. A description will now be given of how, in the pathway from the second cooler 4 via the heat dissipation plate 5, to prevent the heat generated from the capacity module 1 from thermally interfering with the first cooler 2 via the heat dissipation plate 5.

First, as shown in FIG. 1, a structure is adopted in which the heat dissipation plate 5 is connected to the second cooler 4 without via the first cooler 2.

For example, as shown in FIG. 1, the second cooler 4 is disposed on the first cooler 2, and furthermore, the heat dissipation plate 5 is disposed on, and connected for the top of the second cooler 4 in the connecting portion of the second cooler 4 connected to the first cooler 2, thereby enabling the heat dissipation plate 5 to be connected to the second cooler 4 without via the first cooler 2.

In this way, when the heat dissipation plate 5 can be connected to the second cooler 4 without via the first cooler 2, the heat generated from the capacity module 1, after being dissipated to the heat dissipation plate 5, once by way of the pathway of heat dissipation from the second cooler 4, is dissipated from the first cooler 2 to the refrigerant. When the heat dissipation plate 5 is connected to the second cooler 4 without via the first cooler 2, the heat dissipated from the heat dissipation plate 5 to the first cooler 2 turns to be only the remaining heat left over after one portion of the heat has been dissipated from the heat dissipation plate 5 via the second cooler 4, and it is possible co prevent the heat, which is generated from the capacity module 1 and dissipated via the heat dissipation plate 5, from thermally interfering with the capacity module 1.

Figure 3:
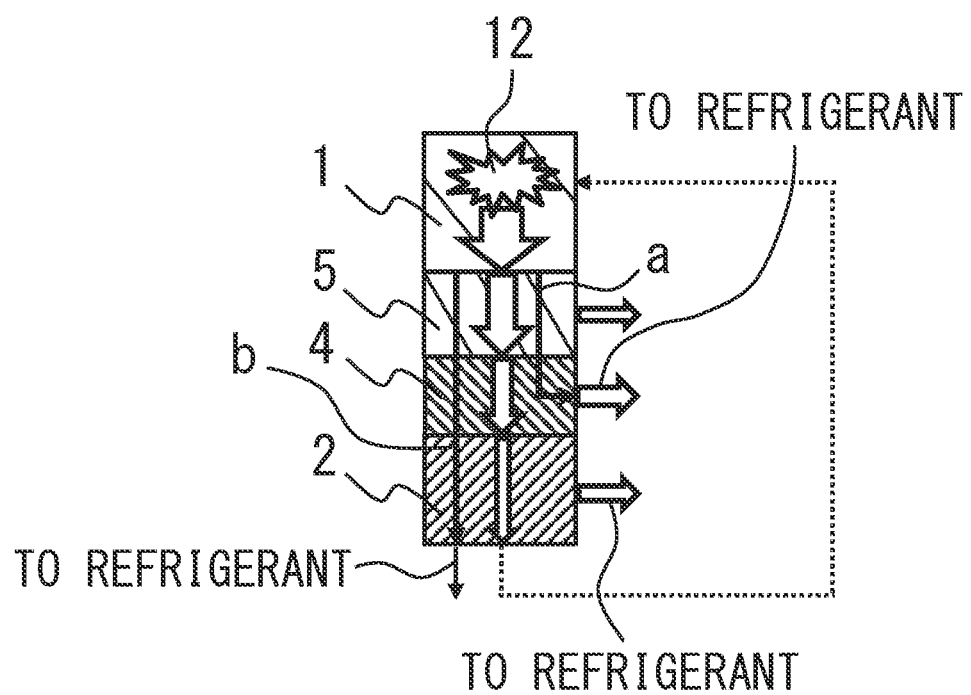
FIG. 3 is a view schematically showing heat dissipation pathways of the power conversion device according to the first embodiment of the present disclosure.

FIG. 3 is a view schematically showing the heat dissipation pathways of the power conversion device according to the first embodiment of the present disclosure.

Secondly, as shown in FIG. 3, a configuration is adopted such that the first thermal resistance of a first cooling pathway a in which the heat generated from a heat generation source 12 which is the capacity module 1 is dissipated from the second cooler 4 to the refrigerant via the heat dissipation plate 5 is lower than the second thermal resistance of a second cooling pathway b in which the heat generated from the capacity module 1 is dissipated from the first cooler 2 to the refrigerant via the heat dissipation plate 5 and the second cooler 4.

When the thermal resistance is low, the heat conduction wherein the heat generated from the capacity module 1 transfers to the second cooler 4 is high, and the amount of heat dissipation from the second cooler 4 increases. As a result, the heat which is generated from the capacity module 1 and dissipated via the heat dissipation plate 5 is larger in the amount (heat dissipation amount) of heat dissipated from the second cooler 4 to the refrigerant than the heat dissipated from the first cooler 2 to the refrigerant. That is, the heat generated from the capacity module 1 decreases in the amount of neat dissipated from the first cooler 2 to the refrigerant, enabling prevention of the thermal interference with the first cooler 2.

The thermal resistance decreases with an increase in cooling performance. That is, when the cooling performance of the second cooler 4 is made higher than that of the first cooler 2, the thermal resistance of the first cooling pathway a in which the heat is dissipated from the second cooler 4 is low, so that it is possible, as previously described, to prevent the heat of the capacity module 1 from thermally interfering with the first cooler 2.

At this time, when the thermal resistance of the heat dissipation plate is high even though the cooling performance of the second cooler 4 is higher than that of the first cooler 2, the heat generated from the capacity module 1 is difficult to dissipate to the second cooler 4. As the pathway of dissipating the heat generated from the capacity module 1, when roughly divided, there are the pathway of heat dissipation via the heat dissipation plate 5 and the pathway of heat dissipation via the first cooler 2 connected to the capacity module 1, but when the thermal resistance of the heat dissipation plate 5 is high, as previously described, the heat to the pathway of heat dissipation via the first cooler 2, out of the heat generated from the capacity module 1, relatively increases.

When the heat dissipation performance of the second cooler 4 is increased to a required amount of heat dissipation in order to keep low the relative ratio of the heat dissipated to the first cooler 2, out of the heat generated from the capacity module 1, it is necessary to increase the size of the second cooler 4.

In order that the size of the second cooler 4 is equal to or smaller than an acceptable size, the heat dissipation plate 5 is required to be decreased in thermal resistance, for example, by using a material of low thermal resistance or by increasing the width or thickness of the heat dissipation plate 5 and thus decreasing the thermal resistance. As previously described, the heat dissipation plate 5 is, for example, a copper plate, and the first cooler 2 is formed of a metal alloy containing aluminum and specifically is an aluminum die-casting. Also, a heatsink which is the second cooler 4 is formed of aluminum. When comparing materials, in general, the heat dissipation plate 5 formed of copper is higher in heat dissipation performance (cooling performance) than the second cooler 4 formed of aluminum. Also, in general, the second cooler 4 formed of aluminum is higher in heat dissipation performance (cooling performance) than the first cooler 2 formed of a metal alloy containing aluminum. However, the thermal resistance can be adjusted according not only to material but, as described above, to width, thickness, and surface area.

In addition to the previously described heat dissipation plate 5 decreased in thermal resistance, it is further possible, by improving the heat dissipation performance (cooling performance) of the second cooler 4, to prevent the heat generated from the capacity module 1 from thermally interfering with the second cooler 2 via the heat dissipation plate 5. As the method of improving the heat dissipation performance (cooling performance) of the second cooler 4, there are a method whereby the heat from the heat dissipation plate 5 is efficiently moved to the second cooler 4 by using a material of low thermal resistance, such as a metal material, as the material of the second cooler 4, thus improving the heat dissipation performance (cooling performance) and a method whereby the fins 9 are provided in the cooling pathway of the second cooler 4, increasing the surface area, thus improving the heat dissipation performance (cooling performance).

In particular, according to the power conversion device 50 of the first embodiment of the present disclosure, it is possible, when providing the fins 9 on the second cooler 4, to facilitate the method of processing the second cooler 4.

A description will now be given of a method of processing a cooler. As the method of processing a cooler with the fins 9, such as the second cooler 4, there is extruding, machining, or the like. Extruding is characterized by being able to reduce processing costs, and machining by being able to accurately prepare complex cooling fins.

On the other hand, when manufacturing a large-sized cooler with fins, the extruding has more difficulty in adjusting and managing temperature, friction, extruding speed, pressure regulation, and the like, than when manufacturing a small-sized extrusion. The larger in size, the longer processing time the machining needs. Because of this, it is desirable that a cooler with fins is small in size.

Commonly, the heat generation of the semiconductor module 3 is higher than that of the capacity module 1. For this reason, it is desirable to adopt a cooler with the fins 9 for the second cooler 4 which cools the semiconductor module 3. Meanwhile, it is also possible to eliminate the need for the fins on the first cooler 2 which cools the capacity module 1 which generates less heat.

In the power conversion device 50 of the first embodiment of the present disclosure, the first and second coolers 2 and 4 are separated from each other before being assembled, and the second cooler 4 can be processed with the projection area thereof remaining small, so that it is possible to process the second cooler 4 separately from the first cooler 2. At this time, the second cooler 4 can be processed into a cooler with the fins 9 and into a size required for heat dissipation, so that there is an advantageous effect in that it is able to be processed with ease.

On the other hand, when a cooler with no fins is adopted for the first cooler 2, there is no need for a complex technique, and it can be processed by sheet metal processing or by easy die casting, eliminating the need for highly difficult processing in order to process the entire cooler wherein the first and second coolers 2 and 4 are assembled together.

In this way, the cooling performance for the semiconductor module 3 requiring more cooling can be improved by carrying out the processing of, for example, providing the fins 9 on the second cooler 4, while the cooling performance required for the capacity module 1 can be secured by dissipating the heat of the capacity module 1 from the second cooler 4 via the heat dissipation plate 5 and also from the first cooler 2 as well. Also, the major portion of the cooling path is manufactured by the easy processing method, thereby enabling processing costs to be kept low.

Figure 4:
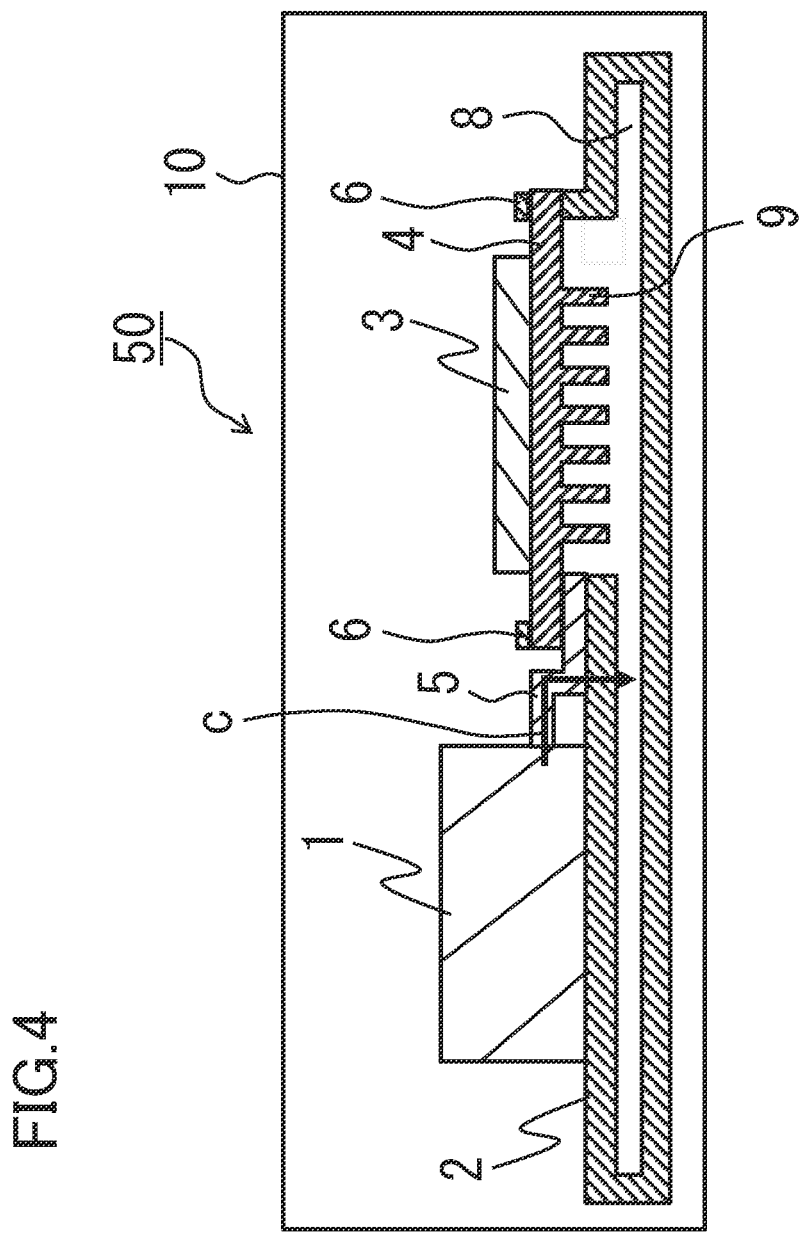
FIG. 4 is a side view showing a modification example of the power conversion device according to the first embodiment of the present disclosure.

FIG. 4 is a side view showing a modification example of the power conversion device according to the first embodiment of the present disclosure. When the heat generated from the capacity module 1 can afford the thermal interference with the first cooler 2 via the heat dissipation plate 5, it is possible to adopt the structure in which the heat dissipation plate 5 is sandwiched between the first and second coolers 2 and 4 and is connected to both the first and second coolers 2 and 4, as shown in FIG. 4. In this case, one portion of the heat dissipated from the heat dissipation plate 5 is dissipated to the first cooler 2 without via the second cooler 4. The same structure is lower in heat dissipation performance than when the heat of the capacity module 1 is dissipated by connecting the heat dissipation plate 5 to the second cooler 4 without via the first cooler 2, but the heat dissipation plate 5 can be fixed by being sandwiched between the first and second coolers 2 and 4, so that it is possible to reduce the number of steps of fixing the heat dissipation plate 5.

According to the modification example of the power conversion device according to the first embodiment of the present disclosure, as shown in FIG. 4, the first thermal resistance of the first cooling pathway a in which the heat generated from the capacity module 1 is dissipated from the second cooler 4 to the refrigerant via the heat dissipation plate 5 is lower than the third thermal resistance of a third cooling pathway c in which the heat generated from the capacity module 1 is dissipated from the first cooler 2 to the refrigerant via the heat dissipation plate 5.

As above, according to the power conversion device 50 of the first embodiment of the present disclosure, the power conversion device 50 includes the first cooler 2 which, having mounted thereon the capacity module 1, cools the heat generated from the capacity module 1, the second cooler 4 which, having mounted thereon the semiconductor module 3, cools the heat generated from the semiconductor module 3, and the heat dissipation plate 5 which, being thermally connected to the capacity module 1 and to the second cooler 4, dissipates via the second cooler 4 one portion of the heat generated from the capacity module 1, wherein the first and second coolers 2 and 4 and the heat dissipation plate 5 are housed in the housing 10. Also, in the power conversion device 50 according to the first embodiment of the present disclosure, the first and second coolers 2 and 4, being disposed so as to form the registrant flow path 8, both share the registrant. That is, in the power conversion device 50 according to the first embodiment of the present disclosure, the first and second coolers 2 and 4 configure all the refrigerant flow path 8 (cooling path), which offers the structure in which the identical refrigerant cooling the first and second coolers 2 and 4 flows through the cooling path.

By so doing, according to the power conversion device 50 of the first embodiment of the present disclosure, even when the heat generation of the capacity module 1 is high, the heat generated from the capacity module 1 is dissipated, preventing a rise in the temperature of the capacity module 1, thereby enabling sufficient cooling, as a result of which it is possible to obtain the power conversion device 50 reduced in size and weight.

Accordingly, even when a high current is supplied, it does not happen that the capacity module 1 melts with the heat, and furthermore, with the refrigerant flow path 8 (cooling path) as one route, it is not necessary to provide, for example, an additional cooler for the capacity module 1, so that it does not happen that the cooler in the power conversion device 50 increases in size and weight, consequently enabling a reduction in the size and weight of the power conversion device 50.

In the power conversion device 50 according to the first embodiment of the present disclosure, the heat dissipation plate 5 is preferably of a material which is high in insulation properties and thermal conductivity, but a material having these characteristics is generally high in price. In order to lower the cost, a metallic material is often used for the heat dissipation plate 5. In this case, the capacity module 1 and the second cooler 4 have to be electrically insulated from each other. The heat dissipation plate 5 is electrically insulated from either the capacity module 1 or the second cooler 4, thereby enabling the capacity module 1 and the second cooler 4 to be electrically insulated from each other. That is, the heat dissipation plate 5 is thermally connected to either or both the capacity module 1 and the second cooler 4 via an insulating member.

Second Embodiment

Figure 5:
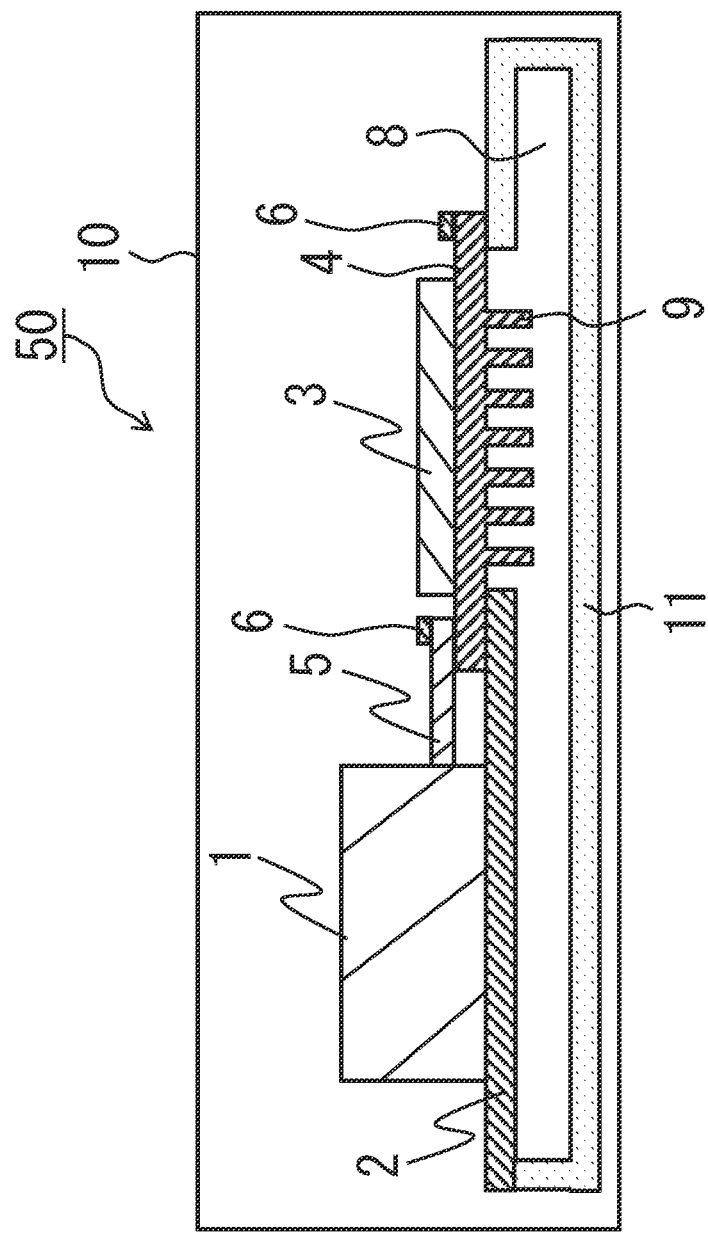
FIG. 5 is a side view showing a power conversion device according to the second embodiment of the present disclosure.

FIG. 5 is a side view showing a power conversion device according to the second embodiment of the present disclosure. As shown in FIG. 5, in the power conversion device 50 according to the second embodiment of the present disclosure, the first cooler 2 is a heatsink which is a metal plate, and another casing which is a third cooler 11 is provided. According to the power conversion device 50 of the second embodiment of the present disclosure, the first and second coolers 2 and 4 are disposed so as to configure one portion of the refrigerant flow path 8 (cooling path). The third cooler 11 is disposed so as to configure the refrigerant flow path 8 together with the first and second coolers 2 and 4.

Figure 6:
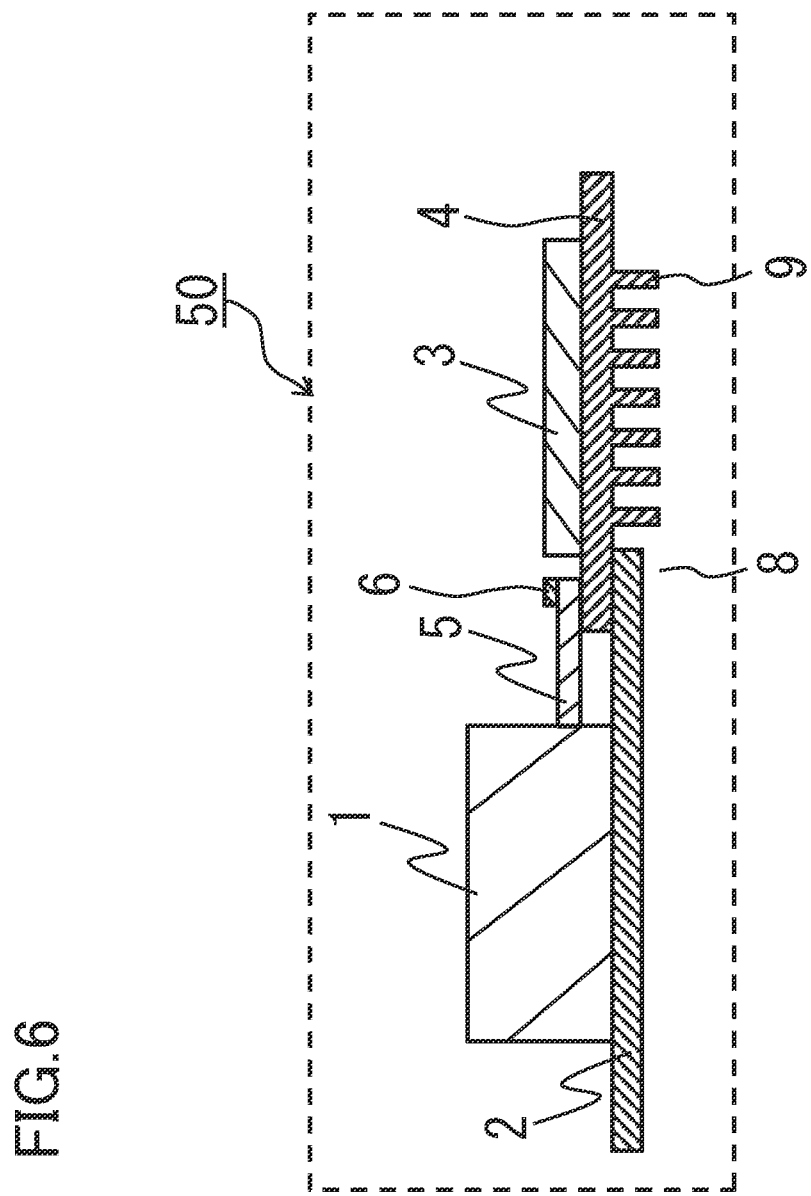
FIG. 6 is a side view showing a modification example of the power conversion device according to the second embodiment of the present disclosure.

FIG. 6 is a side view showing a modification example of the power conversion device according to the second embodiment of the present disclosure. As shown in FIG. 6, in the modification example of the power conversion device 50 according to the second embodiment of the present disclosure, the first cooler 2 is a heatsink which is a metal plate, and the refrigerant flow path 8 (cooling path) formed by the first and second coolers 2 and 4 is in an open state, and the refrigerant is, for example, air which circulates with a fan (not shown).

As above, according to the power conversion device 50 of the second embodiment of the present disclosure, even when the heat generation of the capacity module is high, the heat generated from the capacity module 1 is dissipated, preventing a rise in the temperature of the capacity module 1, thereby enabling sufficient cooling, as a result of which it is possible to obtain the power conversion device 50 reduced in size and weight.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A power conversion device, comprising:
    a first cooler which, having mounted thereon a capacity module, cools heat generated from the capacity module;
    a second cooler which, having mounted thereon a semiconductor module, cools heat generated from the semiconductor module; and
    a heat dissipation plate which, being thermally connected to the capacity module and to the second cooler, dissipates via the second cooler one portion of the heat generated from the capacity module, wherein
    the first and second coolers, being disposed so as to form a refrigerant flow path, both share a refrigerant, and
    the second cooler is fixed to the first cooler together with the heat dissipation plate by a fixing member.

2. The power conversion device according to claim 1, wherein
    the heat dissipation plate, being a copper plate, is connected to the second cooler without via the first cooler.

3. The power conversion device according to claim 2, wherein
    the heat dissipation plate is connected to the connecting portion of the second cooler connected to the first cooler.

4. The power conversion device according to claim 2, wherein
    the heat dissipation plate is thermally connected to either or both the capacity module and the second cooler via an insulating member.

5. The power conversion device according to claim 2, wherein
    the first thermal resistance of a first cooling pathway in which the heat generated from the capacity module is dissipated from the second cooler to the refrigerant via the heat dissipation plate is lower than the second thermal resistance of a second cooling pathway in which the heat generated from the capacity module is dissipated from the first cooler to the refrigerant via the heat dissipation plate and the second cooler, or than the third thermal resistance of a third cooling pathway in which the heat generated from the capacity module is dissipated from the first cooler to the refrigerant via the heat dissipation plate.

6. The power conversion device according to claim 2, wherein
the second cooler is provided on the first cooler via a seal member.

7. The power conversion device according to claim 2, wherein
the first cooler is a casing or is a first heatsink which is of a metal plate, and
the second cooler is a second heatsink having fins thereon.

8. The power conversion device according to claim 7, wherein
when the first cooler is the casing, the casing is formed of a metal alloy containing aluminum with the refrigerant inside, and
the second heatsink is formed of aluminum.

9. The power conversion device according to claim 7, wherein
when the first cooler is the first heatsink, a third cooler is further disposed which configures the refrigerant flow path together with the first and second coolers.

10. The power conversion device according to claim 7, wherein
when the first cooler is the first heatsink, the refrigerant flow path formed by the first and second coolers is in an open state, and the refrigerant is circulating air.

11. The power conversion device according to claim 1, wherein
the heat dissipation plate is connected to the connecting portion of the second cooler connected to the first cooler.

12. The power conversion device according to claim 1, wherein
the heat dissipation plate is thermally connected to either or both the capacity module and the second cooler via an insulating member.

13. The power conversion device according to claim 1, wherein
the first thermal resistance of a first cooling pathway in which the heat generated from the capacity module is dissipated from the second cooler to the refrigerant via the heat dissipation plate is lower than the second thermal resistance of a second cooling pathway in which the heat generated from the capacity module is dissipated from the first cooler to the refrigerant via the heat dissipation plate and the second cooler, or than the third thermal resistance of a third cooling pathway in which the heat generated from the capacity module is dissipated from the first cooler to the refrigerant via the heat dissipation plate.

14. The power conversion device according to claim 1, wherein
the second cooler is provided on the first cooler via a seal member.

15. The power conversion device according to claim 1, wherein
the first cooler is a casing or is a first heatsink which is of a metal plate, and
the second cooler is a second heatsink having fins thereon.

16. The power conversion device according to claim 15, wherein
when the first cooler is the casing, the casing is formed of a metal alloy containing aluminum with the refrigerant inside, and
the second heatsink is formed of aluminum.

17. The power conversion device according to claim 15, wherein
when the first cooler is the first heatsink, a third cooler is further disposed which configures the refrigerant flow path together with the first and second coolers.

18. The power conversion device according to claim 15, wherein
when the first cooler is the first heatsink, the refrigerant flow path formed by the first and second coolers is in an open state, and the refrigerant is circulating air.

19. A power conversion device, comprising:
a first cooler which, having mounted thereon a capacity module, cools heat generated from the capacity module;
a second cooler which, having mounted thereon a semiconductor module, cools heat generated from the semiconductor module; and
a heat dissipation plate which, being thermally connected to the capacity module and to the second cooler, dissipates via the second cooler one portion of the heat generated from the capacity module, wherein
the first and second coolers, being disposed so as to form a refrigerant flow path, both share a refrigerant,
the first cooler is a first casing having inside thereof the refrigerant or is a first heatsink which is of a metal,
the second cooler is a second heatsink having fins thereon,
when the first cooler is the first casing, the first casing is formed of a metal alloy containing aluminum,
the second heatsink is formed of aluminum, and
when the first cooler is the first heatsink, a third cooler is further disposed which configures the refrigerant flow path together with the first and second coolers.

* * * * *